United States Patent
Kobayashi et al.

(10) Patent No.: US 8,476,560 B2
(45) Date of Patent: Jul. 2, 2013

(54) THERMAL PROCESSING FURNACE (75) Inventors: Makoto Kobayashi, Nirasaki (JP);
Kenichi Yamaga, Nirasaki (JP); Ken Nakao, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1194 days.

(21) Appl. No.: 12/320,433

(22) Filed: Jan. 26, 2009

(65) Prior Publication Data
US 2009/0194521 A1   Aug. 6, 2009

(30) Foreign Application Priority Data
Jan. 31, 2008   (JP) ................ 2008-021231

(51) Int. Cl.
*F27B 5/14*    (2006.01)
*F27D 11/02*   (2006.01)
*H05B 3/66*    (2006.01)

(52) U.S. Cl.
USPC ........... 219/390; 219/402; 219/411; 219/530; 219/542; 373/117; 373/130; 373/131

(58) Field of Classification Search
None
See application file for complete search history.

(56) References Cited

U.S. PATENT DOCUMENTS

| | | | | |
|---|---|---|---|---|
| 5,095,192 A | * | 3/1992 | McEntire et al. | 219/402 |
| 5,187,771 A | * | 2/1993 | Uchida | 392/416 |
| 5,676,869 A | | 10/1997 | Nakayama et al. | |
| 6,008,477 A | * | 12/1999 | Nakao et al. | 219/390 |
| 6,807,220 B1 | | 10/2004 | Peck | |
| 7,888,622 B2 | * | 2/2011 | Nakao et al. | 219/385 |
| 8,134,100 B2 | * | 3/2012 | Kobayashi et al. | 219/385 |

FOREIGN PATENT DOCUMENTS

| | | |
|---|---|---|
| CN | 1820545 A | 8/2006 |
| JP | 10-233277 | 9/1998 |
| KR | 10-0366395 | 3/2003 |
| KR | 10-2006-0070482 | 6/2006 |

OTHER PUBLICATIONS

Korean Office Action mailed on Jul. 27, 2011 for Application No. 10-2009-7212 with English translation.
Chinese Office Action issued on May 16, 2012 for Application No. 200910001971.7 with English translation.

\* cited by examiner

*Primary Examiner* — Joseph M Pelham
(74) *Attorney, Agent, or Firm* — Smith, Gambrell & Russell, LLP (57) ABSTRACT

A thermal processing furnace comprises: a tubular heat insulation member 4 surrounding a processing vessel 3 for receiving and thermally processing an object to be processed w; a heating resistor 5 helically arranged on an inner circumferential surface of the heat insulation member 4; and a support member 13 disposed on the inner circumferential surface of the heat insulation member 4, the support member 13 supporting the heating resistor 5 such that the heating resistor 5 can be thermally expanded and thermally shrunk. The thermal processing furnace further comprises: a movement prevention member 15 disposed on the heating resistor 5 to be in contact with one side surface of the support member 13 so as to prevent a downward movement of the heating resistor 5.

8 Claims, 7 Drawing Sheets

THERMAL PROCESSING FURNACE

CROSS REFERENCE TO RELATED APPLICATIONS

This application is based upon and claims the benefit of priority from the prior Japanese Patent Application No. 2008-021231 filed on Jan. 31, 2008, the entire contents of which are incorporated herein by reference.

FIELD OF THE INVENTION

The present invention relates to a thermal processing furnace for thermally processing an object to be processed received therein.

BACKGROUND ART

In a manufacturing method of a semiconductor device, various thermal processing apparatuses are used for subjecting an object to be processed, which is a semiconductor wafer, to an oxidation process, a diffusion process, a CVD (Chemical Vapor Deposition) process, and so on. A general thermal processing apparatus includes a thermal processing furnace that is composed of a processing vessel (reaction tube) configured to receive a semiconductor wafer and to thermally process the same, a heating resistor disposed around the processing vessel, and a heat insulation member disposed around the heating resistor. The heating resistor is arranged on an inner wall surface of the heat insulation member via support members.

In a thermal processing apparatus capable of performing a batch process, for example, there is used, as the heating resistor, a helical heating element arranged along an inner wall surface of a cylindrical heat insulation member, so that an inside of a furnace can be heated to a high temperature such as from about 800° C. to about 1000° C., for example. There is used, as the heat insulation member, a member formed by baking a heat insulation material such as ceramic fibers into a cylindrical shape, so as to assist effective heating by decreasing a heat quantity which is lost as radiant heat and conductive heat. There are used, as the support members, members made of ceramics which support the heating element at predetermined pitches such that the heating element can be thermally expanded and thermally shrunk.

In the above thermal processing furnace, in order that the heating element can be thermally expanded and thermally shrunk, the heating element, which is helically formed, is supported such that a clearance is defined between the heating element and the heat insulation member. However, by using the heating element under a high temperature, the heating element undergoes a creep strain, and slowly increases in length over time. In addition, the heating element is thermally expanded during a heating operation. Moreover, there is an apparatus that quickly cools the heating element by blowing air thereto so as to decrease a temperature thereof. Due to the repeated rise and drop in temperature, the heating element is likely to be deformed. This may generate a short-circuit between adjacent parts of the deformed heating element, which may invite disconnection.

Particularly in a vertical-type thermal processing furnace, the heating element is moved in the support members because of the repeated heat expansion and heat shrinkage caused by the rise and drop in temperature, and the heating element is moved downward little by little because of gravitation. Then, the moving amount is accumulated at a lowermost turn of the heating element. Namely, because of the accumulation of the movement of the heating element, a winding diameter of the lowermost turn is increased. When the heating element of the increased winding diameter reaches an inner surface of the heat insulation member and cannot be expanded outside any more, the heating element is then deformed in the up and down direction. Thus, there is a possibility that a short-circuit occurs between a part and another part adjacent thereto of the heating element, resulting in some disconnection by a heat of a spark generated upon the short-circuit.

In order to solve these problems, the following structure has been proposed. Namely, with a view to preventing such an accumulation to one side of the elongated heating element caused by the creep and the thermal expansion or the like, a rod-like fixing member projecting outward in a radial direction of the furnace is attached to an outside portion of the heating resistor by welding, with a fore end of the fixing member being buried to be fixed in the heat insulation member (see, JP10-233277A).

However, in the above structure in which the fixing member is joined to the outside portion of the heating resistor by welding, and the heating resistor is fixed by burying the fixing member in the heat insulation member, there is a possibility that the radial movement of the heating resistor caused by the thermal expansion and thermal shrinkage thereof is restrained. In this case, it can be considered that a stress tends to concentrate on the joined portion of the fixing member fixed on the heating resistor, which entails deterioration in durability (reduction in lifetime) of the heating resistor. Further, since the fixing member has a bar-like shape, the fixing member may easily drop out of the heat insulation member, whereby it is difficult to secure a sufficient holding force of the heating resistor, which may deteriorate the durability of the heating resistor.

DISCLOSURE OF THE INVENTION

The present invention has been made under the above circumstances. The object of the present invention is to provide a thermal processing furnace which is capable of preventing the heating resistor from moving downward while allowing a radial movement of the heating resistor caused by a thermal expansion and a thermal shrinkage thereof, as well as improving a durability of the heating resistor.

A thermal processing furnace of the present invention is a thermal processing furnace comprising: a tubular heat insulation member surrounding a processing vessel for receiving and thermally processing an object to be processed; a heating resistor helically arranged on an inner circumferential surface of the heat insulation member; a support member disposed on the inner circumferential surface of the heat insulation member, the support member supporting the heating resistor such that the heating resistor can be thermally expanded and thermally shrunk; and a movement prevention member disposed on the heating resistor to be in contact with one side surface of the support member so as to prevent a downward movement of the heating resistor.

It is preferable that the thermal processing furnace of the present invention further comprises a plurality of terminal plates disposed on the heating resistor, the terminal plates passing radially through the heat insulation member to be extended to the outside.

In the thermal processing furnace of the present invention, it is preferable that the movement prevention member is secured on the heating resistor by welding, such that the movement prevention member does not project from the heating resistor toward the heat insulation member but projects in an up and down direction of the heating resistor.

In the thermal processing furnace of the present invention, it is preferable that each of the support members has a horizontally extended horizontal part whose fore end is buried in the heat insulation member, and a vertically extended vertical part disposed on a rear end of the horizontal part, and that an upper surface of the horizontal part and a front surface of the vertical part are formed as curved surfaces.

In such a thermal processing apparatus, it is preferable that a groove is longitudinally formed in a lower surface of the horizontal part.

In the thermal processing furnace of the present invention, it is preferable that the movement prevention member comprises a plurality of movement prevention members, and that one movement prevention member is shifted in a circumferential direction of the heat insulation member from other movement prevention members vertically adjacent to the one movement prevention member.

In such a thermal processing apparatus, it is preferable that the support member comprises a plurality of support members that are disposed in the circumferential direction of the heat insulation member, and that a certain support member on which the one movement prevention member can abut is located on a position that is different in the circumferential direction of the heat insulation member from a position or positions of other support members on which other movement prevention members vertically adjacent to the one movement prevention member can abut.

In the thermal processing furnace of the present invention, it is preferable that the movement prevention member is made of the same material as a material of the heating resistor.

According to the present invention, since the support member is disposed on the inner circumferential surface of the heat insulation member, the support member supporting the heating resistor such that the heating resistor can be thermally expanded and thermally shrunk, and the movement prevention member is disposed on the heating resistor to be in contact with one side surface of the support member so as to prevent a downward movement of the heating resistor, the downward movement of the heating resistor can be prevented while allowing a radial movement of the heating resistor caused by the thermal expansion and the thermal shrinkage, to thereby improve a durability of the thermal processing furnace including the heating resistor.

MODE FOR CARRYING OUT THE INVENTION

Figure 1:
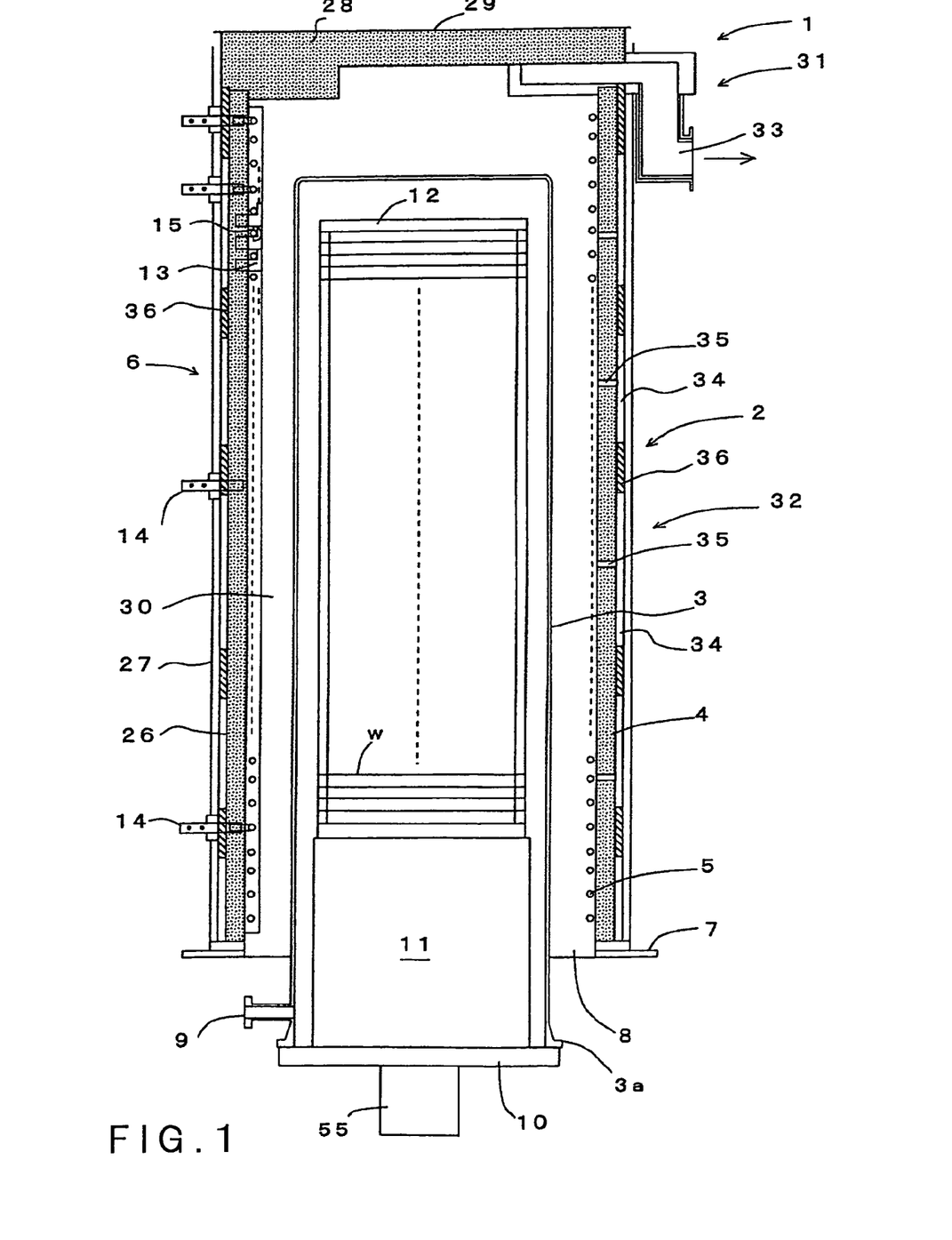
FIG. 1 is a longitudinal sectional view schematically showing an embodiment of a thermal processing furnace of the present invention.
Figure 2:
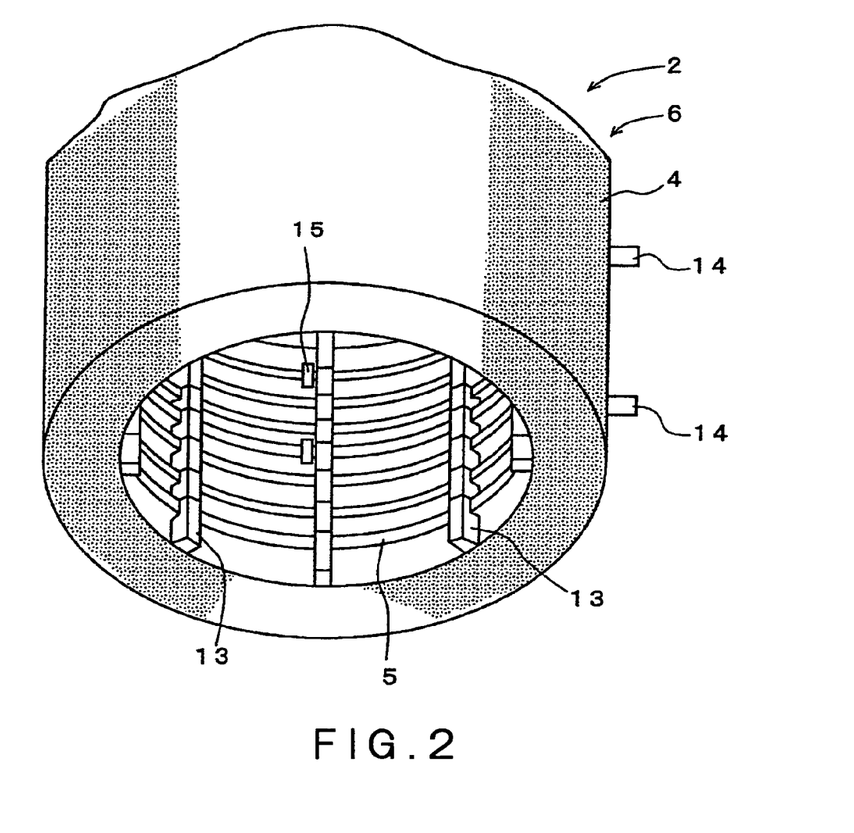
FIG. 2 is a perspective view showing a part of the thermal processing furnace.
Figure 3:
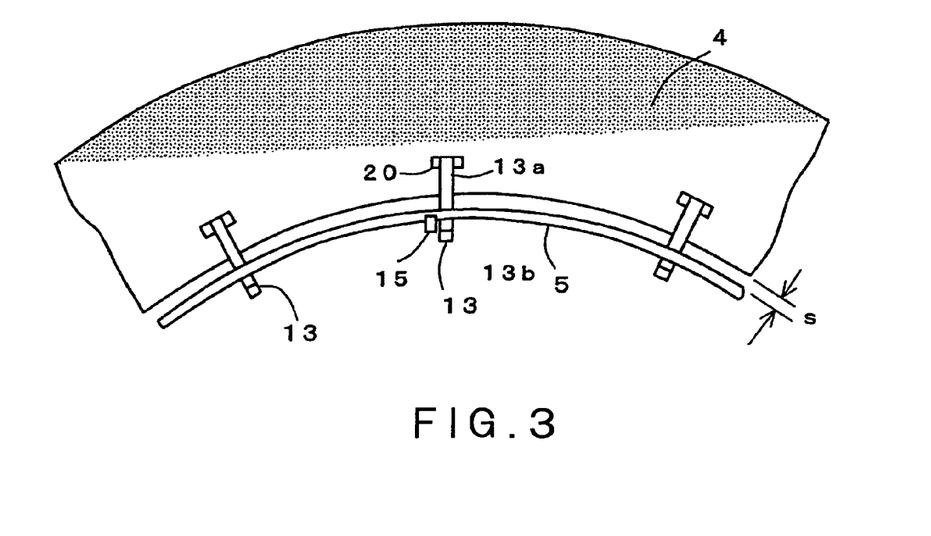
FIG. 3 is a partial cross-sectional view showing the thermal processing furnace.
Figure 4:
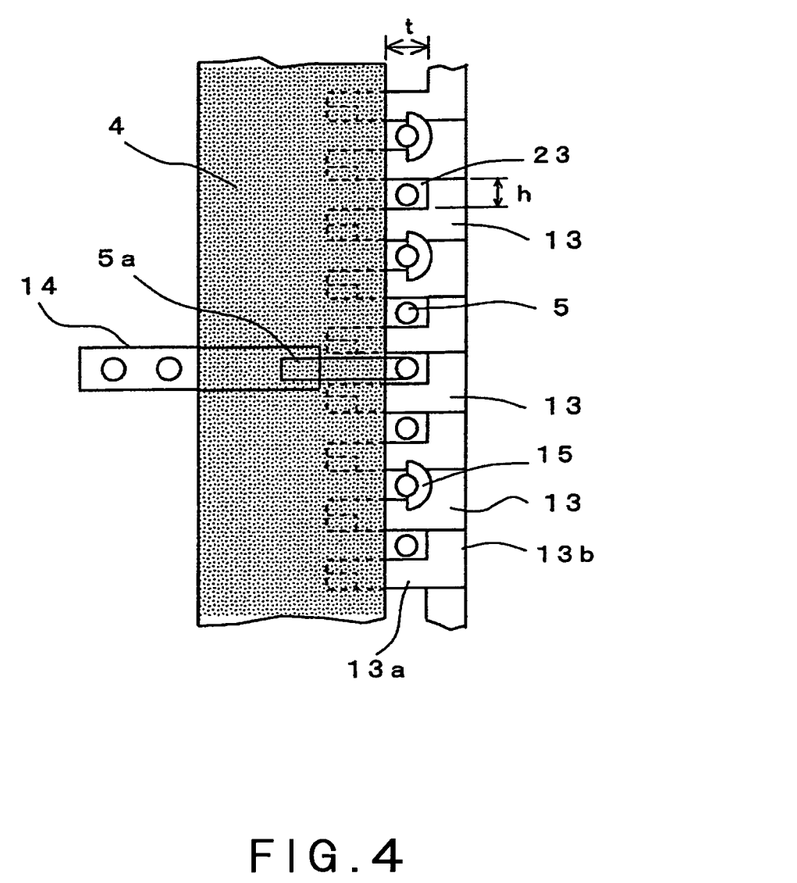
FIG. 4 is a partial longitudinal sectional view showing the thermal processing furnace.

The mode for carrying out the present invention will be described herebelow with reference to the accompanying drawings. FIG. 1 is a longitudinal sectional view schematically showing an embodiment of a thermal processing furnace of the present invention. FIG. 2 is a perspective view showing a part of the thermal processing furnace. FIG. 3 is a partial cross-sectional view showing the thermal processing furnace. FIG. 4 is a partial longitudinal sectional view showing the thermal processing furnace.

In FIG. 1, the reference number 1 depicts a vertical-type thermal processing apparatus which is one of semiconductor manufacturing apparatuses. The thermal processing apparatus 1 has a vertical-type thermal processing furnace 2 capable of simultaneously receiving a number of objects to be processed such as semiconductor wafers w, and subjecting thereto thermal processes such as an oxidation process, a diffusion process, a reduced-pressure CVD process, and so on. The thermal processing furnace 2 is mainly composed of a processing vessel (also referred to as "reaction tube") 3 configured to receive the wafers w in a tier-like manner and performs thereto a predetermined thermal process, a tubular heat insulation member 4 surrounding the processing vessel 3, and a helical heating resistor (also referred to as "heating element") 5 arranged along an inner circumferential surface of the heat insulation member 4. The heat insulation member 4 and the heating resistor 5 constitute a heater (heating apparatus) 6.

The thermal processing apparatus 1 includes a base plate 7 on which the heater 6 can be placed. The base plate 7 is provided with an opening 8 through which the processing vessel 3 can be inserted upward from below. The opening 8 has a heat insulation member, not shown, which seals a gap between the base plate 7 and the processing vessel 3.

The processing vessel 3, which is also referred to as "process tube", is made of quartz. The processing vessel 3 is formed to have an elongated cylindrical shape, with an upper opening thereof being closed and a lower end opening thereof being opened. An outward flange 3a is formed on an edge of the lower opening of the processing vessel 3, and the flange 3a is supported on the base plate 7 via a flange presser, not shown. The illustrated processing vessel 3 is equipped with, in a lower part thereof, an introduction port (introduction opening) 9 through which a process gas, an inert gas, and so on is introduced into the processing vessel 3, and a discharge port (discharge opening), not shown, through which a gas in the processing vessel 3 is discharged. A gas supply source is connected to the introduction port 9. Connected to the discharge port is an exhaust system including a vacuum pump capable of controlling a pressure in the processing vessel 3 to be reduced to, e.g., 10 to $10^{-8}$ Torr (1.3 to $1.3 \times 10^{-9}$ kPa).

Disposed below the processing vessel 3 is a lid member 10 capable of opening and closing the lower end opening (furnace opening) of the processing vessel 3 in an up and down direction. The lid member 10 can be elevated and lowered by an elevating mechanism, not shown. A means for retaining heat of the furnace opening, such as a heat retention tube 11, is placed on an upper part of the lid member 10. Placed on an upper part of the heat retention tube 11 is a quartz wafer boat 12 serving as a holder for holding a number of, e.g., about 100 to 150 wafers w each having a diameter of, e.g., 300 mm at predetermined vertical intervals therebetween. The lid member 10 is provided with a rotational mechanism 55 configured to rotate the boat 12 about an axis thereof. The boat 12 is unloaded from the processing vessel 3 to a lower loading area by the downward movement of the lid member 10. After replacement of the wafers w, the boat 12 is loaded into the processing vessel 3 by the upward movement of the lid member 10.

Figure 6:
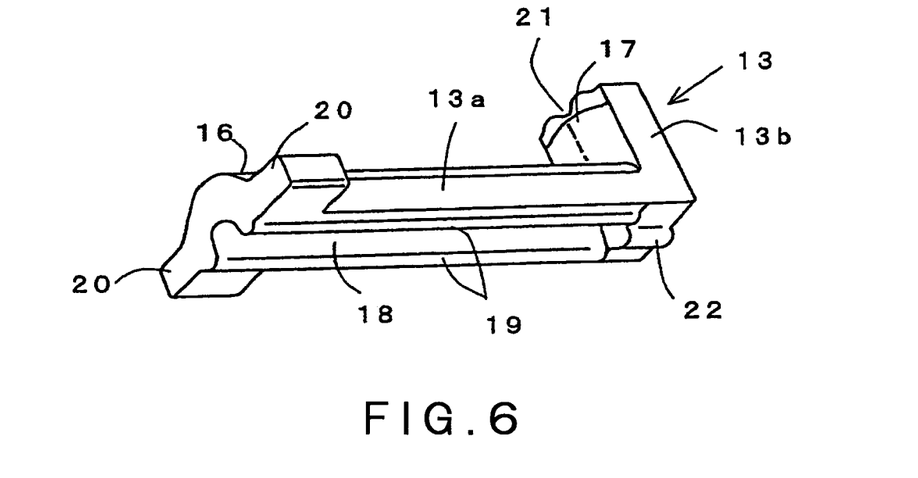
FIG. 6 is a perspective view showing a support member.
Figure 7:
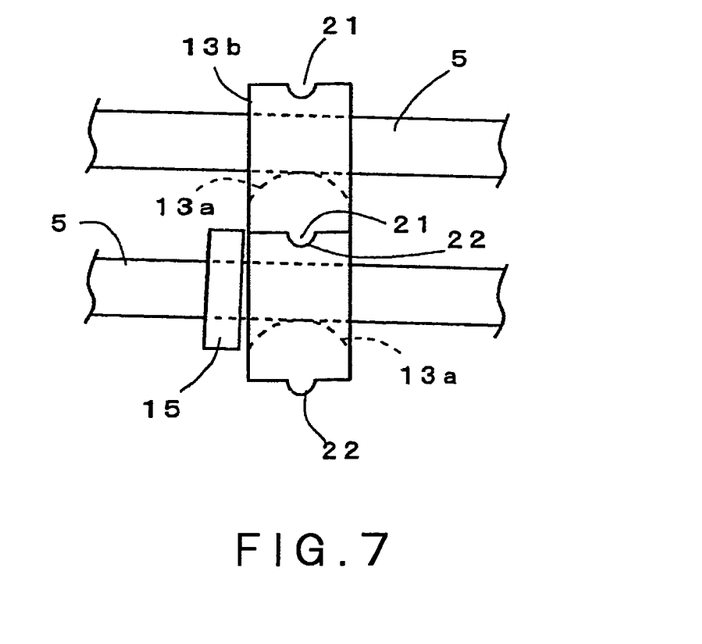
FIG. 7 is a view showing a relationship between the support member and a movement prevention member.
Figure 8:
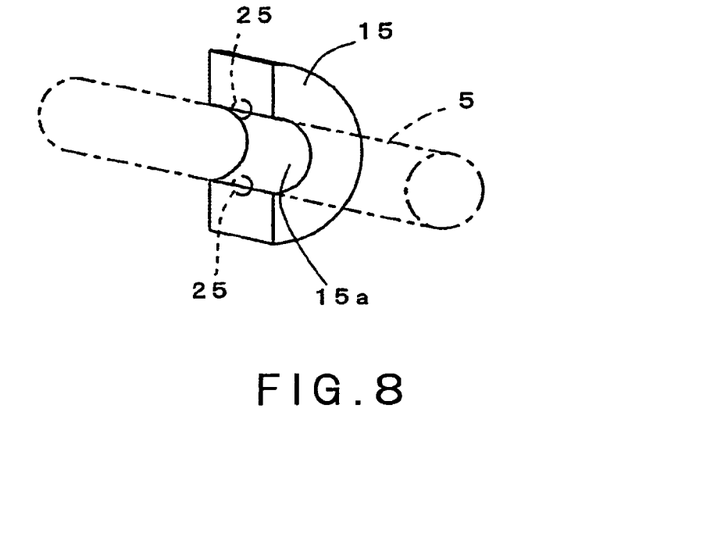
FIG. 8 is a perspective view of the movement prevention member.
Figure 9:
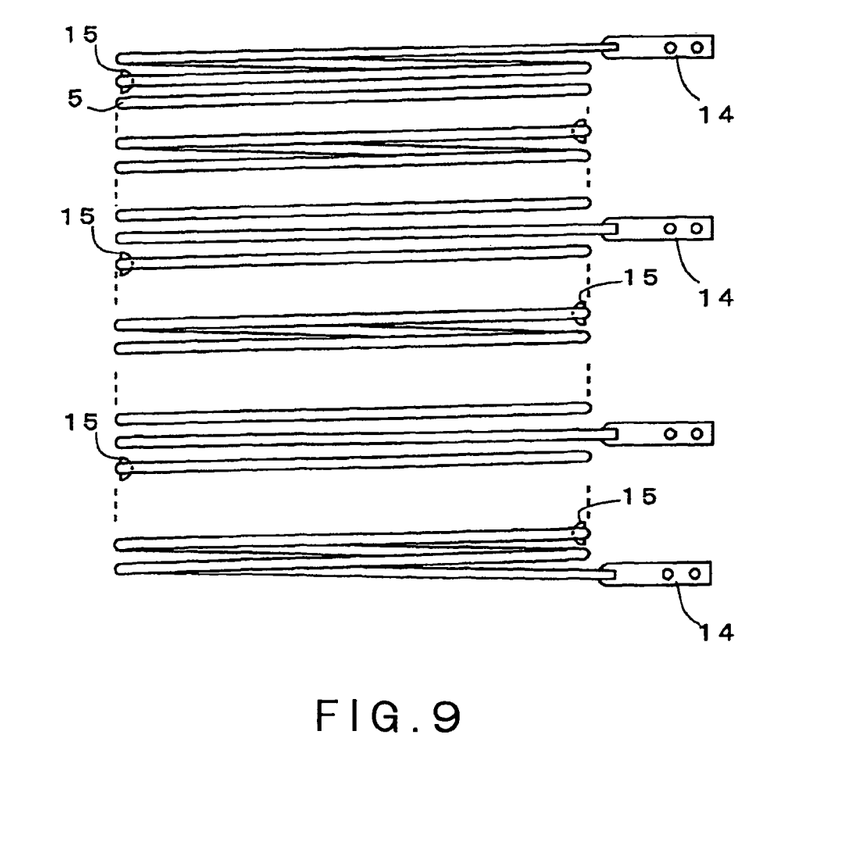
FIG. 9 is a side view of the heating resistor.

FIG. 5(a) is a view partially showing a fixing structure of a terminal member on a heating resistor, and FIG. 5(b) is a side view of FIG. 5(a). FIG. 6 is a perspective view showing a support member. FIG. 7 is a view showing a relationship between the support member and a movement prevention member. FIG. 8 is a perspective view of the movement prevention member. FIG. 9 is a side view of the heating resistor.

As shown in FIGS. 2 to 6, the heater 6 includes: the heat insulation member 4; the helical heating resistor 5 arranged along the inner circumference of the heat insulation member 4; support members 13 arranged on the inner circumferential surface of the heat insulation member 4 at predetermined axial pitches therebetween so as to support the heating resistor 5; a plurality of terminal plates 14 disposed outside the heating resistor 5 at suitable axial intervals therebetween, the terminal plates 14 passing radially through the heat insulation member 4 to be extended to the outside; and movement prevention members (stoppers) 15 disposed on the heating resistor 5 at every predetermined turn(s) (e.g., at every 1.5 turns) thereof, the movement prevention members 15 being in contact with one surface of the support members 13 so as to prevent downward movement of the heating resistor 5.

The heating resistor 5 is formed of a kanthal line which is an alloy line containing, for example, iron (Fe), chrome (Cr), and aluminum (Al). Although a thickness of The heating resistor 5 differs depending on a specification of the thermal processing furnace 2, there is used the heating resistor 5 having a diameter of about 4 mm, for example.

The heating resistor 5 is formed into a helical shape having a predetermined winding diameter and predetermined pitches along the inner wall surface of the heat insulation member 4 such that the heating resistor 5 do not contact the heat insulation member 4. An inner diameter of the heat insulation member is, e.g., 600 mm. The heating resistor 5 is supported inside the cylindrical heat insulation member 4 via the support members 13, which is made of a material having a heat resistance and an electrically insulation property such as ceramics, with predetermined arrangement pitches such as 10 mm pitches for securing a predetermined heat quantity and with a predetermined clearance s, such as the clearance s of 10 mm, which is defined between the heating resistor 5 and the inner wall surface of the heat insulation member 4, such that the heating resistor 5 is thermally expandable and thermally shrinkable (movable in the radial direction and in the circumferential direction of the helical shape).

As shown in FIGS. 3, 6, and 7, each of the support members 13 has a horizontally extended horizontal part 13a whose fore end is buried in the heat insulation member 4, and a vertically extended vertical part 13b which is disposed on a rear end of the horizontal part 13a (the vertical part 13b is projected from the rear end). In order to reduce a frictional resistance generated when the heating resistor 5 is slid by the thermal expansion and the thermal shrinkage, it is preferable that at least an upper surface of the horizontal part 13a and a front surface of the vertical part 13b, which surfaces may contact the heating resistor 5, are formed as curved surfaces. In this embodiment, as shown in FIG. 6, an upper R part 16 is formed on the upper surface of the horizontal part 13a, and an R part 17 in a reactor core direction is formed on the front surface of the vertical part 13b. In order to decrease a heat capacity of the support member 13, a groove 18 is longitudinally formed in a lower surface of the horizontal part 13a.

In addition, lower R parts 19 are formed on opposed sides of the groove 18 formed in the lower surface of the horizontal part 13a. Thus, if the heating resistor 5 comes in contact with the lower surface of the horizontal part 13a, a frictional resistance therebetween can be made smaller. Disposed on a fore end of the horizontal part 13a is a protrusion 20 protruding to both sides so as to prevent falling down of the support member 13 from the heat insulation member 4. A recess 21 and a projection 22, which are engageable with each other, are formed on an upper end and a lower end of the vertical part 13b of the support member 13. As shown in FIG. 7, by vertically superposing the vertical parts 13b of the support members 13 with the recess 21 and the projection 22 being engaged with each other, the support members 13 are serially arranged at predetermined pitches in the axial direction of the heat insulation member 4. The support members 13 are circumferentially arranged on the inner circumferential surface of the heat insulation member 4 at predetermined intervals such as 30 degrees. A gap t between the inner wall surface of the heat insulation member 4 and the front surface of the vertical part 13b of the support member 13 is, e.g., 10 mm. A gap h of a groove 23 formed between the horizontal parts 13a of the vertically adjacent support members 13 is, e.g., 5 mm.

As shown in FIGS. 4 and 9, the heating resistor 5 has terminal plates 14 passing through the heat insulation member 4 to extend outside so as to be connected to electrodes, such that the terminal plates 14 are arranged at suitable intervals therebetween in the axial direction of the heat insulation member 4. Thus, the inside of the processing vessel 3, which is the inside of the thermal processing furnace 2, can be divided into a plurality of zones in the up and down direction, whereby a temperature of each zone can be controlled. The terminal plate 14 is made of the same material as that of the heating resistor 5, and has a plate-like shape of a certain cross-section area, in terms of prevention of meltdown and inhibition of heat release.

Figure 5:
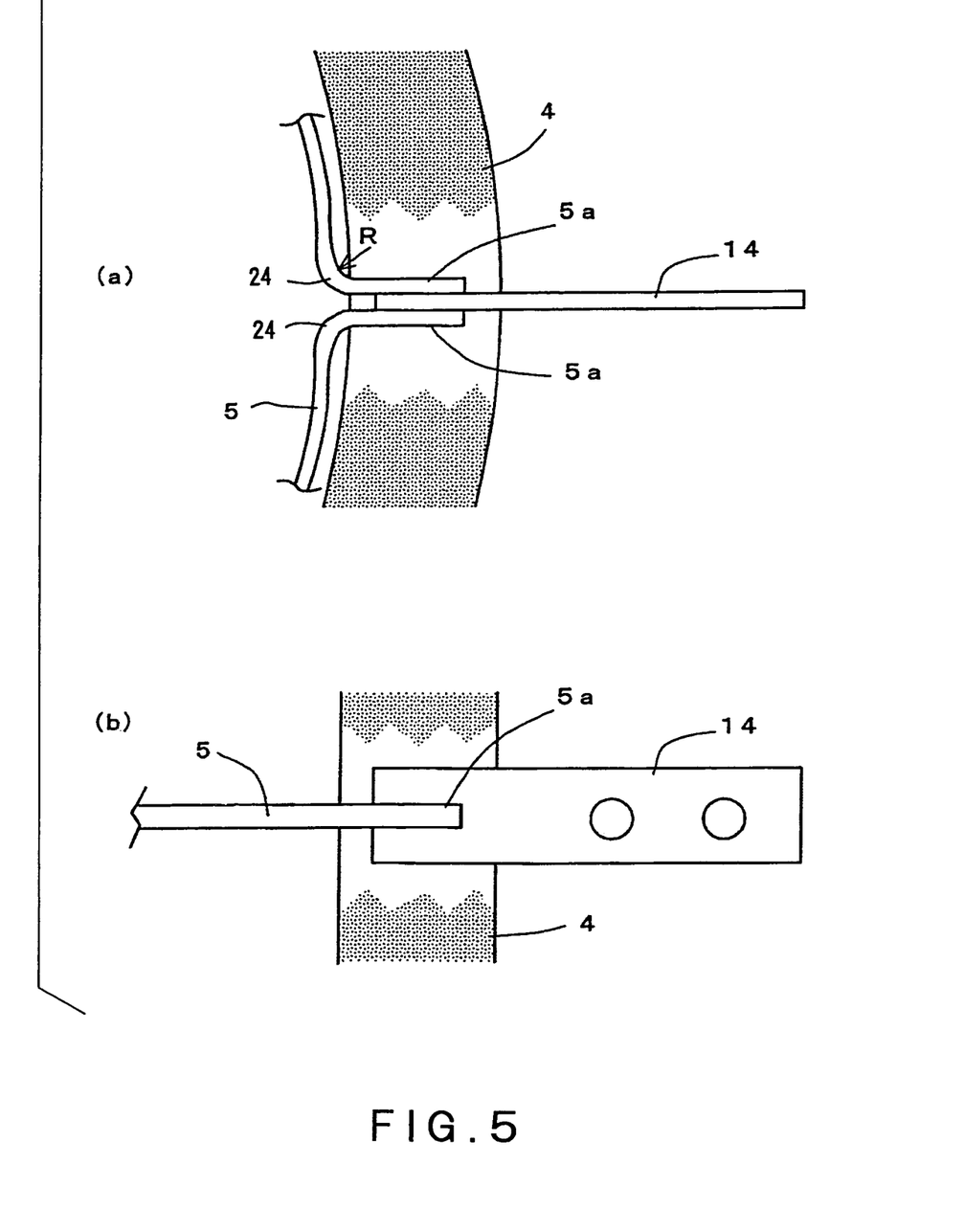
FIG. 5(a) is a view partially showing a fixing structure of a terminal member on a heating resistor.
FIG. 5(b) is a side view of FIG. 5(a).

In order to fix the terminal plate 14, as shown in FIG. 5, the heating resistor 5 is severed at its intermediate position by a fixing portion of the terminal plate 14. Opposed end parts 5a of the severed heating resistor 5 are bent outward in the radial direction of the heat insulation member 4, and the bent opposed end parts 5a are fixed on opposed surfaces of the terminal plate 14 by welding. In particular, in order to mitigate stress concentration on the welded portion, a bent part 24 of each severed end part 5a of the heating resistor 5 is machined by R-bending process.

Although the helical heating resistor 5 that is vertically located is secured on the heat insulation member 4 through the terminal plates 14 in the respective zones, the heating resistor 5 is supported by the support members 13 so as to be thermally expanded and thermally shrunk. Thus, under this state, when the heating resistor 5 is elongated by creep and/or thermal expansion, the elongation tends to be accumulated by gravitation on a lower part of each zone. Thus, as shown in FIGS. 7 and 9, with a view to preventing such an accumulation of the elongation of the heating resistor 5 by gravitation on the lower part of each zone, movement prevention members 15 are disposed on the heating resistor 5 at every predetermined turn(s) thereof. The movement prevention member 15 is in contact with one side surface of the support member 13 (in FIG. 7, a left side surface because the heating resistor is downwardly inclined to the right) so as to prevent the downward movement of the heating resistor 5.

Figure 10:
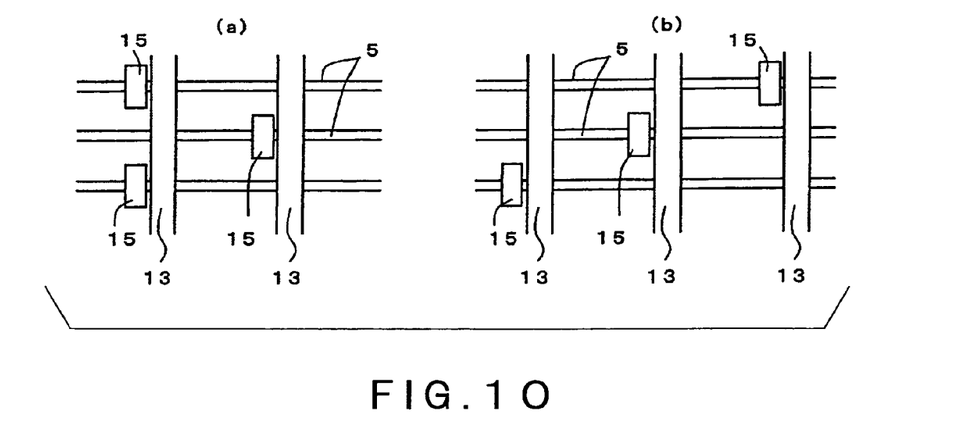
FIG. 10 is an explanatory view for explaining another arrangement example of the movement prevention member.

When the movement prevention members 15 are disposed at every one turn of the heating resistor 5, there is a possibility that, when the vertically adjacent movement prevention members 15 contact each other, a short-circuit occurs therebetween. Thus, it is preferable that one movement prevention member 15 is shifted in the circumferential direction of the heat insulation member 4 from other movement prevention members 15 vertically adjacent the one movement prevention member 15. To be specific, as shown in FIGS. 10(a) and 10(b), it is preferable that a certain support member 13 on which the one movement prevention member 15 can abut is located on a position that is different in the circumferential direction of the heat insulation member 4 from a position (see FIG. 10(a)) or positions (see FIG. 10(b)) of other support members 13 on which other movement prevention members 15 vertically adjacent to the one movement prevention member 15 can abut (the movement prevention members 15 are circumferentially shifted from each other by one pitch or several pitches of the support members 13 in order that the movement prevention members 15 are not vertically adjacent to each other). Thus, it can be prevented that the movement prevention members 15 come into contact with each other so as to generate a short-circuit.

The movement prevention member 15 is made of the same material as that of the heating resistor 5. As shown in FIG. 8, the movement prevention member 15 is secured on the heating resistor 5 by welding portions 25 such that the movement prevention member 15 does not project from the heating resistor 5 toward the heat insulation member (radially outward) but projects in the up and down direction of the heating resistor 5. In the illustrated example, it is preferable that the movement prevention member 15 has a shape (semi-circular shape or substantially C-shape) that is obtained by cutting a ring capable of fitting on the outer circumference of the heating resistor 5, and that the movement prevention member 15 is secured on the heating resistor by the pair of upper and lower welding portions 25, with a recessed groove 15a of the movement prevention member 15 being engaged with the inner circumferential side of heating resistor. In this manner, the movement prevention member 15 is prevented from contacting the heat insulation member 4, while the movement prevention member 15 can be freely moved in the radial direction. At the same time, when the movement of the heating resistor 5 is prevented, generation of moment and stress concentration on the heating resistor 5 can be prevented.

Figure 11:
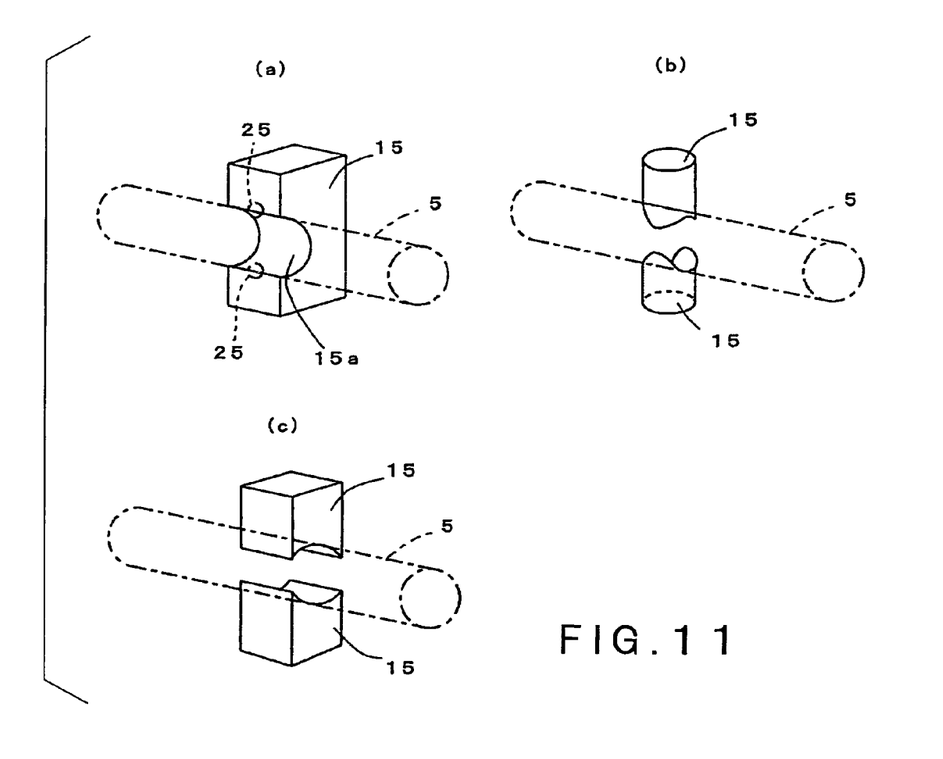
FIG. 11 is an explanatory view for explaining another shape example of the movement prevention member.

FIG. 11 shows another shape example of the movement prevention member 15. As shown in FIG. 11(a), the movement prevention member 15 may be a vertically elongated rectangular parallelepiped having the recessed groove 15a formed in an intermediate portion in the up and down direction. Alternatively, as shown in FIG. 11(b), the movement prevention member 15 may be composed of round bars which are secured on the upper and lower portions of the heating resistor 5. Alternatively, as shown in FIG. 11(c), the movement prevention member 15 may be composed of square bars which are secured on the upper and lower portions of the heating resistor 5.

As shown in FIG. 1, in order to hold the shape of the heat insulation member 4 and to reinforce the heat insulation member 4, the outer circumference of the heat insulation member 4 is covered with a metal, such as stainless, outer shell 26. In addition, the outer circumference of the outer shell 26 is covered with a water cooling jacket 27 so as to restrain a thermal influence on the outside of the heater. An upper the heat insulation member 28 covering the heat insulation member 4 is disposed on a top part thereof. Disposed on an upper part of the upper heat insulation member 28 is a stainless top plate 29 for covering a top part (upper end part) of the outer shell 26.

In order to accelerate a process and improve a throughput by rapidly lowering the temperature of a wafer after a thermal process, the heater 6 is equipped with a heat exhaust system 31 for discharging an atmosphere in a space 30 between the heater 6 and the processing vessel 3 to the outside, and a cooling means 32 for forcibly cooling a temperature by introducing a cooling fluid (e.g., air) into the space 30. The heat exhaust system 31 is mainly composed of, for example, an exhaust port 33 formed in an upper part of the heater 6, and a heat exhaust pipe, not shown, connecting the exhaust port 33 and a factory exhaust system, not shown. An exhaust blower and a heat exchanger, which are not shown, are disposed in the heat exhaust pipe.

The cooling means 32 has a plurality of annular flow paths 34 formed between the heat insulation member 28 and the outer shell 26 in a height direction, and blowing holes 35 formed in the heat insulation member 4 for blowing a cooling fluid from the respective annular flow paths 34 into the space 30.

Disposed on the outer surface of the outer shell 26 along the height direction is a common single supply duct, not shown, for distributing and supplying a cooling fluid into the respective annular flow paths 34. The outer shell 26 has throughholes that communicate the supply duct and the annular flow paths 34. Connected via an opening and closing valve to the supply duct is a cooling-fluid supply source (e.g., blower), not shown, which sucks air in a clean room as a cooling fluid and pressingly supplies the same.

According to the thermal processing furnace 2 as structured above, since there are axially arranged the support members 13 at predetermined pitches, each support member 13 supporting the helical heating resistor 5 on the inner circumferential surface of the tubular heat insulation member 4 such that the heating resistor 5 can be thermally expanded and thermally shrunk in the radial direction, and the movement prevention members 15 are disposed on the heating resistor 5 at every predetermined turn(s) thereof, the movement prevention members 15 being in contact with one side surface of the support member 13 so as to prevent the downward movement of the heating resistor, it is possible to prevent that the elongation of the heating resistor 5 by a creep and/or a thermal expansion is accumulated on one end side. Thus, there is no possibility that a winding diameter on the one side end of the heating resistor 5 is increased so that the heating resistor 5 comes into contact with the inner circumferential surface of the heat insulation member 4. Thus, deformation such as buckle of the heating resistor 5 and breakage thereof caused by a short-circuit can be prevented. As a result, the durability of the heating resistor 5 can be improved. In addition, the heating resistor itself is not fixed by a fixing member as in the conventional example, but the heating resistor 5 is allowed to be radially, thermally expanded and thermally shrunk. Thus, no moment and/or stress concentration is generated on the heating resistor 5, whereby the durability of the heating resistor 5 and thus the thermal processing furnace 2 can be improved (life spans thereof can be elongated).

The present invention is not limited to the above embodiment, and various changes can be made within the scope of the present invention. For example, connected to the lower end part of the processing vessel may be a cylindrical manifold made of a refractory metal such as a stainless steel having an inlet pipe part and an outlet pipe part. Alternatively, the processing vessel may be of a double pipe structure.

The invention claimed is:

1. A thermal processing furnace comprising:
   a tubular heat insulation member surrounding a processing vessel for receiving and thermally processing an object to be processed;
   a heating resistor helically arranged on an inner circumferential surface of the heat insulation member;
   a support member disposed on the inner circumferential surface of the heat insulation member, the support member supporting the heating resistor such that the heating resistor can be thermally expanded and thermally shrunk; and
   a movement prevention member disposed on the heating resistor to be in contact with only one side surface of the support member so as to prevent a downward movement of the heating resistor.

2. The thermal processing furnace according to claim 1, further comprising a plurality of terminal plates disposed on the heating resistor, the terminal plates passing radially through the heat insulation member to be extended to the outside.

3. The thermal processing furnace according to claim 1, wherein
   the movement prevention member is secured on the heating resistor by welding, such that the movement prevention member does not project from the heating resistor toward the heat insulation member but projects in an up and down direction of the heating resistor.

4. The thermal processing furnace according to claim 1, wherein
   the movement prevention member comprises a plurality of movement prevention members, and
   one movement prevention member is shifted in a circumferential direction of the heat insulation member from other movement prevention members vertically adjacent to the one movement prevention member.

5. The thermal processing furnace according to claim 4, wherein
   the support member comprises a plurality of support members that are disposed in the circumferential direction of the heat insulation member, and
   a certain support member on which the one movement prevention member can abut is located on a position that is different in the circumferential direction of the heat insulation member from a position or positions of other support members on which other movement prevention members vertically adjacent to the one movement prevention member can abut.

6. The thermal processing furnace according to claim 1, wherein
   the movement prevention member is made of the same material as a material of the heating resistor.

7. The thermal processing furnace according to claim 1, wherein
   each of the support members has a horizontally extended horizontal part whose fore end is buried in the heat insulation member, and a vertically extended vertical part disposed on a rear end of the horizontal part,
   the rear of the horizontal part is located in the inner side of the inner circumferential surface of the heat insulation member,
   the vertical part extends vertically in the inner side of the inner circumferential surface of the heat insulation member,
   a front surface of the vertical part is opposed to the inner circumferential surface of the heat insulation member, and
   an upper surface of the horizontal part and the front surface of the vertical part are formed as curved surfaces.

8. The thermal processing furnace according to claim 7, wherein
   the horizontally extended horizontal part extends in a longitudinal direction, and
   a groove is formed in a downward surface of the horizontal part, and extends along the longitudinal direction.

* * * * *